United States Patent
Xu et al.

(10) Patent No.: US 11,545,581 B2
(45) Date of Patent: Jan. 3, 2023

(54) METAL OXIDE (MO) SEMICONDUCTOR AND THIN-FILM TRANSISTOR AND APPLICATION THEREOF

(71) Applicant: SOUTH CHINA UNIVERSITY OF TECHNOLOGY, Guangzhou (CN)

(72) Inventors: Miao Xu, Guangzhou (CN); Hua Xu, Guangzhou (CN); Min Li, Guangzhou (CN); Junbiao Peng, Guangzhou (CN); Lei Wang, Guangzhou (CN); Jian Hua Zou, Guangzhou (CN); Hong Tao, Guangzhou (CN)

(73) Assignee: SOUTH CHINA UNIVERSITY OF TECHNOLOGY, Guangzhou (CN)

(*) Notice: Subject to any disclaimer, the term of this patent is extended or adjusted under 35 U.S.C. 154(b) by 0 days.

(21) Appl. No.: 17/158,026

(22) Filed: Jan. 26, 2021

(65) Prior Publication Data

US 2021/0151606 A1 May 20, 2021

Related U.S. Application Data

(63) Continuation-in-part of application No. 16/529,833, filed on Aug. 2, 2019.

(30) Foreign Application Priority Data

Nov. 20, 2020 (CN) .......................... 202011314502.3

(51) Int. Cl.
*H01L 29/66* (2006.01)
*H01L 29/786* (2006.01)

(52) U.S. Cl.
CPC .. *H01L 29/78693* (2013.01); *H01L 29/66742* (2013.01)

(58) Field of Classification Search
CPC ......... H01L 29/78693; H01L 29/66742; H01L 21/02266; H01L 21/02581; H01L 21/30604
USPC .......................................................... 257/43
See application file for complete search history.

(56) References Cited

U.S. PATENT DOCUMENTS

| 2005/0017302 A1* | 1/2005 | Hoffman | ........... H01L 29/78696 |
| | | | 438/149 |
| 2005/0039670 A1* | 2/2005 | Hosono | ............. H01L 29/66969 |
| | | | 257/E29.147 |
| 2005/0199959 A1* | 9/2005 | Chiang | ............... H01L 29/7869 |
| | | | 257/368 |

(Continued)

*Primary Examiner* — Sheikh Maruf

(57) ABSTRACT

The present invention discloses a metal oxide (MO) semiconductor, which is implemented by respectively doping at least an oxide of rare earth element R and an oxide of rare earth element R' into an indium-containing MO semiconductor to form an $In_xM_yR_nR'_mO_z$ semiconductor. According to the present invention, the extremely high oxygen bond breaking energy in the oxide of rare earth element R is used to effectively control the carrier concentration in the semiconductor, and a charge transportation center can be formed by using the characteristic that the radius of rare earth ions is equivalent to the radius of indium ions, so that the electrical stability of the semiconductor is improved. The present invention further provides a thin-film transistor based on the MO semiconductor and application thereof.

4 Claims, 3 Drawing Sheets

(56) References Cited

U.S. PATENT DOCUMENTS

| | | | | |
|---|---|---|---|---|
| 2006/0091793 | A1* | 5/2006 | Baude | H01L 27/1218 313/506 |
| 2006/0108529 | A1* | 5/2006 | Saito | H01L 31/032 257/E31.093 |
| 2008/0308796 | A1* | 12/2008 | Akimoto | H01L 29/78693 257/E29.296 |
| 2009/0294764 | A1* | 12/2009 | Kim | H01L 29/78693 252/512 |
| 2012/0012835 | A1* | 1/2012 | Herman | H01L 21/02565 257/E29.296 |
| 2012/0187395 | A1* | 7/2012 | Koezuka | H01L 29/66969 257/E29.296 |
| 2013/0009219 | A1* | 1/2013 | Yamazaki | H01L 29/7869 257/E21.409 |
| 2013/0200375 | A1* | 8/2013 | Yamazaki | H01L 29/04 438/479 |
| 2013/0320330 | A1* | 12/2013 | Yamazaki | H01L 29/045 257/43 |
| 2016/0218224 | A1* | 7/2016 | Ota | H01L 21/30604 |
| 2016/0293641 | A1* | 10/2016 | Sato | H01L 29/78603 |
| 2017/0170332 | A1* | 6/2017 | Yamazaki | H01L 27/1225 |
| 2017/0263783 | A1* | 9/2017 | Yamazaki | H01L 29/786 |
| 2018/0006124 | A1* | 1/2018 | Murakawa | H01L 29/66969 |
| 2018/0012739 | A1* | 1/2018 | Yamazaki | C04B 35/453 |
| 2018/0012910 | A1* | 1/2018 | Yamazaki | H01L 27/1225 |
| 2018/0114838 | A1* | 4/2018 | Endo | H01L 29/4908 |
| 2019/0035937 | A1* | 1/2019 | Yamazaki | H01L 29/78618 |

\* cited by examiner

METAL OXIDE (MO) SEMICONDUCTOR AND THIN-FILM TRANSISTOR AND APPLICATION THEREOF

CROSS REFERENCE TO RELATED APPLICATIONS

The present application is a continuation-in-part-application of U.S. patent application Ser. No. 16/529,833, titled "OXIDE SEMICONDUCTOR THIN-FILM AND THIN-FILM TRANSISTOR CONSISTED THEREOF", filed on Aug. 2, 2019. US parent application Ser. No. 16/529,833 is a continuation of PCT/CN2017/111109, filed on Nov. 15, 2017, and claims foreign priority to Chinese patent application No. 201710229199.9, filed on Apr. 10, 2017. The present application claims foreign priority to Chinese Patent Application No. 201710229199.9, filed on Apr. 10, 2017 and Chinese Patent Application No. 202011314502.3, filed on Nov. 20, 2020, where are hereby incorporated by reference in their entirety.

TECHNICAL FIELD

The present invention relates to the field of semiconductor manufacturing, in particular, to materials and device structures used for manufacturing backboards of metal oxide (MO) semiconductor thin-film transistors in flat panel display and detector applications, and in particular, to an MO semiconductor and a thin-film transistor and application thereof.

BACKGROUND

In a present metal oxide semiconductor system, indium ion ($In^{3+}$) has a relatively large ion radius, which ensures its efficient carrier transport channel with a higher probability of orbital overlap in a multi-element metal oxide, and its 5s orbital is a main electron transport channel. However, on the one hand, due to the lower bond breaking energy of In—O after indium bonds with oxygen, a large number of oxygen vacancy defects are present in pure indium oxide ($In_2O_3$) thin-films. Oxygen vacancy is the main reason for the stability deterioration of metal oxide thin-film transistors. On the other hand, many lattice mismatches occur in indium oxide that forms a film by conventional sputtering. This makes the carrier mobility of the thin-film low, which limits its application in high-performance thin-film transistors. It is generally necessary to dope $Ga^{3+}$ ions with the same amount as $In^{3+}$ ions to regulate the oxygen vacancy. Besides, to ensure the performance uniformity of semiconductor devices, the MO semiconductor thin-film needs to keep an amorphous thin-film structure.

Because the crystal structure of ZnO is quite different from that of $In_2O_3$ and that of $Ga_2O_3$, doping Zn ions with the same amount as In ions in the thin-film can inhibit the crystallization of the material and keep the amorphous structure of the thin-film. Therefore, IGZO (In:Ga:Zn=1:1:1 mol) is the most widely used MO semiconductor material at present.

However, IGZO also has some problems: The addition of a large number of $Ga^{3+}$ and $Zn^{3+}$ ions greatly dilutes the concentration of $In^{3+}$, thereby reducing the overlapping degree of 5s orbitals and lowering the electron mobility.

In addition, IGZO and other materials have a large number of trap states near the valence band. This leads to the generation of photo-induced carriers even if the illumination energy is lower than the band gap, resulting in the poor illumination stability of current MO semiconductors.

SUMMARY

To overcome the shortcomings of the prior art, the present invention provides an MO semiconductor with relatively high mobility and strong illumination stability, which is implemented by using a new co-doping strategy, makes use of the special 4f electron orbital characteristics of rare earth oxides, can control the carrier concentration and obtain an MO semiconductor with strong illumination stability while achieving higher mobility in oxide films with high in ratio.

The new co-doping strategy according to the present invention is to introduce oxide materials of rare earth element R and oxide materials of rare earth element R' with different functions into an MO containing indium, where the oxide of rare earth element R is a carrier concentration control agent and the oxide of rare earth element R' is a light stabilizer, that is, the oxide of rare earth element R' is a charge transportation center, and its action principle is as follows:

The carrier concentration control agent is implemented based on that $Yb^{2+}$ ions and $Eu^{2+}$ ions in ytterbium oxide and europium oxide which are oxides of rare earth element R have full and half full 4f electron orbitals, respectively. Therefore, divalent ions in the oxide of rare earth element R have lower energy in the oxide than trivalent ions. In an oxide semiconductor, when $In^{3+}$ ions are substituted for doping, the carrier concentration can be obviously reduced. In addition, the bond breaking enthalpy changes ($\Delta Hf298$) of Yb—O and Eu—O are 715.1 kJ/mol and 557.0 kJ/mol, respectively, which are much higher than the bond breaking energy (360.0 kJ/mol) of In—O, thereby effectively controlling the oxygen vacancy concentration. In summary, with reference to the above two characteristics, the introduction of the oxide of rare earth element R can effectively control the oxygen vacancy of oxide semiconductor thin-films in a high In system. Because the ion radius of $Yb^{2+}$ is less than that of $Eu^{2+}$, it is more conducive to reducing the In—In distance in the oxide semiconductor, thereby keeping its better high mobility characteristics.

The light stabilizer is implemented based on that the radius of rare earth ions of materials such as praseodymium oxide, terbium oxide, cerium oxide and dysprosium oxide of the oxides of rare earth element R' is equal to the radius of indium ions in indium oxide, and the electron structure of 4f orbitals in the rare-earth ions and 5s orbitals of the indium ions can form an efficient charge transportation center, so as to improve the electrical stability, and especially the stability under illumination.

A second object of the present invention is to provide a thin-film transistor including the MO semiconductor.

A third object of the present invention is to provide application of the thin-film transistor.

The present invention is implemented by using the following technical solution:

A metal oxide semiconductor is provided, where the metal oxide semiconductor is implemented by respectively doping at least an oxide of rare earth element R and an oxide of rare earth elements R' into an indium-containing metal oxide MO—$In_2O_3$ semiconductor to form an $In_xM_yR_nR'_mO_z$ semiconductor material, where $x+y+m+n=1$, $0.4 \leq x \leq 0.9999$, $0 \leq y < 0.5$, $0.0001 \leq (m+n) \leq 0.2$, $m>0$, $n>0$, and $z>0$.

That is, the MO semiconductor according to the present invention is a composite semiconductor based on indium oxide, and two rare earth oxides with different but complementary functions are introduced through co-doping. Oxides of rare earth element R can be selected from ytterbium oxide and europium oxide, which are used as a carrier concentration control agent. $Yb^{2+}$ ions and $Eu^{2+}$ ions in ytterbium oxide and europium oxide are used, which have full and half full 4f electron orbitals, respectively. Therefore, divalent ions in the oxide of rare earth element R have lower energy in the oxide than trivalent ions. In an oxide semiconductor, when $In^{3+}$ ions are substituted for doping, the carrier concentration can be obviously reduced. In addition, the bond breaking enthalpy changes ($\Delta Hf298$) of Yb—O and Eu—O are 715.1 kJ/mol and 557.0 kJ/mol, respectively, which are much higher than the bond breaking energy (360.0 kJ/mol) of In—O, thereby effectively controlling the oxygen vacancy concentration. With reference to the above two characteristics, the introduction of the oxide of rare earth element R can effectively control the oxygen vacancy of oxide semiconductor thin-films in a high In system. Because the ion radius of $Yb^{2+}$ is less than that of $Eu^{2+}$, it is more conducive to reducing the In—In distance in the oxide semiconductor, thereby keeping its better high mobility characteristics.

In addition, oxides of rare earth element R' can be selected from praseodymium oxide, terbium oxide, cerium oxide, and dysprosium oxide. In material selection, an efficient charge transportation center can be formed by using the electron structure characteristics of the 4f orbitals in the rare-earth ions and the 5s orbitals of the indium ions. Under positive bias, the rare-earth ions are in a stable low-energy state. The thin-film has a high carrier concentration due to the modulation of Fermi level, which can effectively shield the carrier scattering effect caused by the transportation center, thereby having no obvious impact on electrical characteristics and the like of a device. Under negative bias, the electron orbitals of rare-earth element 4f are coupled with the 5s orbitals of indium, and the rare-earth ions are in an unstable activated state. On the one hand, this increases the off-state current of the device and enhances the scattering effect on carriers, which makes the subthreshold swing of the device slightly increase; on the other hand, when photo-induced carriers are excited by suitable light, photo-induced electrons are quickly "captured" by the activated transportation center, and the photo-induced carriers and ionized oxygen vacancies recombine in the form of non-radiative transition through their coupling orbitals; in addition, the activation center resumes the activated state. Therefore, the transportation center can provide a fast recombination channel of the photo-induced carriers and prevent their impact on I-V characteristics and stability. The stability of MO semiconductor devices under illumination is greatly improved.

Further, the oxide of the rare earth element R is a carrier concentration control agent; and the oxide of the rare earth element R is one or a combination of ytterbium oxide and europium oxide.

Further, the oxide of the rare earth element R' is a light stabilizer, and the oxide of the rare earth element R' is one material selected from praseodymium oxide, terbium oxide, cerium oxide and dysprosium oxide or a combination of any two or more thereof.

Further, in MO, M is one material selected from Zn, Ga, Sn, Ge, Sb, Al, Mg, Ti, Zr, Hf, Ta, and W or a combination of any two or more thereof.

Further, the MO semiconductor is prepared into a film by using any one of a physical vapor deposition process, a chemical vapor deposition process, an atomic layer deposition process, a laser deposition process, a Reactive-Plasma Deposition (RPD) process and a solution method.

The second objective of the present invention is implemented by adopting the following technical solution:

A thin-film transistor, including a gate electrode, an active layer, an insulating layer located between the gate electrode and the active layer, a source electrode and a drain electrode electrically connected to both ends of the active layer respectively, and a spacer layer, where the active layer is the foregoing MO semiconductor.

That is, the present invention further provides the thin-film transistor composed of the active layer prepared on the basis of the MO semiconductor. The MO semiconductor is implemented by introducing an oxide of rare earth element R and an oxide of rare earth element R' with different functions into an MO containing indium, where the oxide of the rare earth element R is used as a carrier concentration control agent while the oxide of the rare earth element R' is used as a light stabilizer, so that the semiconductor can keep good high mobility characteristics and improve its electrical stability, especially its stability under illumination.

Further, the spacer layer is one layer structure selected from a silicon oxide thin-film, a silicon nitride thin-film and a silicon oxynitride thin-film prepared by plasma-enhanced chemical vapor deposition or a laminated structure composed of any arbitrary two or more thereof.

The third object of the present invention is implemented by adopting the following technical solution:

Application of the thin-film transistor in a display panel or a detector.

Compared with the prior art, the present invention has the following beneficial effects.

According to the present invention, a new co-doping strategy is adopted, two rare earth oxide materials with different functions are introduced into an indium-based MO, so that the carrier concentration is controlled, and good illumination stability of a device is achieved, which provides a new idea for the realization of high-performance MO semiconductor materials in the future.

According to the present invention, at least an oxide of rare earth element R and an oxide of rare earth element R' are introduced into an indium-containing MO to form an MO semiconductor, where the oxide of the rare earth element R is controlled as a carrier and the oxide of the rare earth element R' functions to enhance illumination stability, so as to effectively control the carrier concentration in the oxide semiconductor by using the extremely high oxygen bond breaking energy in the oxide of the rare earth element R. In addition, an efficient charge transportation center can be formed by using the characteristics that the radius of rare-earth ions is equal to that of indium ions in indium oxide, and the electron structure of 4f orbitals in the rare-earth element R' ions and 5s orbitals of the indium ions, so as to improve the electrical stability, and especially the stability under illumination.

Figure 1:
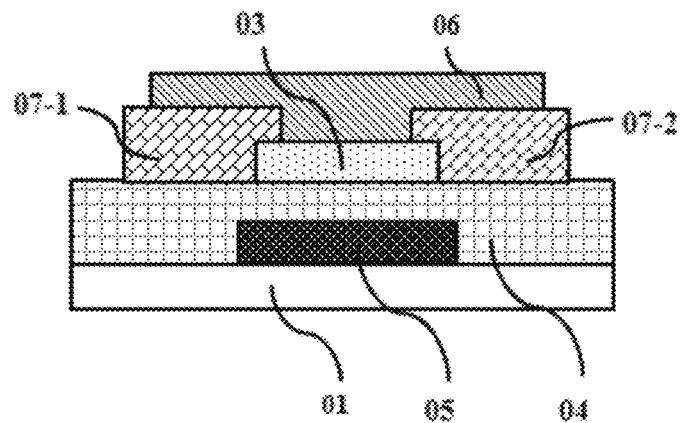
FIG. 1 is a schematic structural diagram of a thin-film transistor of example 13 and example 14.

Reference numbers in the figures: 01. substrate; 02. buffer layer; 03. channel layer; 04. insulating layer; 05. gate electrode; 06. spacer layer; 07-1, source electrode; 07-2. drain electrode; 08. etch-stop layer.

DESCRIPTION OF EMBODIMENTS

The present invention is further described below with reference to the accompanying drawings and specific embodiments. It should be noted that all embodiments described below or all the technical features can be arbitrarily combined to form new embodiments, provided that no conflict occurs.

The following are specific embodiments of the present invention, and the raw materials, equipment, etc. used in the following embodiments can be obtained through purchase except for special restrictions.

Example 1: Praseodymium Oxide- and Europium Oxide-Doped InSnZnO Semiconductor Material An MO semiconductor material is obtained by doping praseodymium oxide as a charge transportation center into InSnZnO, and doping europium oxide as a carrier control agent to form a praseodymium oxide- and europium oxide-doped InSnZnO (Pr—Eu:InSnZnO) semiconductor material.

MO is SnZnO, In:Sn:Zn=3:1:1 mol, which is denoted as In(3)Sn(1)Zn(1); in $In_x(SnZn)_y Eu_n Pr_m O_z$, $x=0.5$, $y=0.3333$, $m=0.05$, and $n=0.1167$. However, the present invention is not limited to the foregoing ratios. In some embodiments, $x=0.53$, $y=0.353$, $m=0.05$, $n=0.067$, or, $x=0.56$, $y=0.373$, $m=0.05$, $n=0.017$, or, $x=0.58$, $y=0.387$, $m=0.03$, $n=0.003$, which will not be repeated herein.

Example 2: Praseodymium Oxide- and Ytterbium Oxide-Doped InZnTiO Semiconductor Material An MO semiconductor material is obtained by doping praseodymium oxide as a charge transportation center into InZnTiO, and doping ytterbium oxide as a carrier control agent to form a praseodymium oxide- and ytterbium oxide-doped InZnTiO (Pr—Yb:InZnTiO) semiconductor material.

MO is ZnTiO, In:Zn:Ti=4:1:0.05 mol, which is denoted as In(4) Zn (1) Ti (0.05); in $In_x(ZnTi)_y Yb_n Pr_m O_z$, $x=0.75$, $y=0.1969$, $m=0.0031$, and $n=0.05$. However, the present invention is not limited to the foregoing ratios. In some embodiments, $x=0.7$, $y=0.1838$, $m=0.0662$, $n=0.05$, or, $x=0.65$, $y=0.17$, $m=0.13$, $n=0.05$, which will not be repeated herein.

Example 3: Terbium Oxide- and Europium Oxide-Doped InGaZnO Semiconductor Material An MO semiconductor material is obtained by doping terbium oxide as a charge transportation center into InGaZnO, and doping europium oxide as a carrier control agent to form a terbium oxide- and europium oxide-doped InGaZnO (Tb—Eu:InGaZnO) semiconductor material.

MO is GaZnO, In:Ga:Zn:=4:0.5:1 mol, which is denoted as In(4) Ga (0.5)Zn(1); in $In_x(GaZn)_y Eu_n Tb_m O_z$, $x=0.65$, $y=0.2438$, $m=0.05$, and $n=0.0562$. However, the present invention is not limited to the foregoing ratios. In some embodiments, $x=0.55$, $y=0.2053$, $m=0.05$, $n=0.1937$, or, $x=0.58$, $y=0.2175$, $m=0.05$, $n=0.1525$, or, $x=0.6$, $y=0.225$, $m=0.05$, $n=0.125$, which will not be repeated herein.

Example 4: Terbium Oxide- and Ytterbium Oxide-Doped InGaZrO Semiconductor Material An MO semiconductor material is obtained by doping terbium oxide as a charge transportation center into InGaZrO, and doping ytterbium oxide as a carrier control agent to form a terbium oxide- and ytterbium oxide-doped InGaZrO (Tb—Yb:InGaZrO) semiconductor material.

MO is GaZrO, In:Ga:Zr=5:1:0.05 mol, which is denoted as In(5) Ga (1) Zr (0.05): in $In_x(GaZr)_y Yb_n Tb_m O_z$, $x=0.7$, $y=0.147$, $m=0.103$, and $n=0.05$. However, the present invention is not limited to the foregoing ratios. In some embodiments, $x=0.65$, $y=0.1365$, $m=0.1635$, $n=0.05$, or, $x=0.63$, $y=1323$, $m=0.1877$, $n=0.05$, or, $x=0.74$, $y=0.1554$, $m=0.0546$, $n:=0.05$, which will not be repeated herein.

Example 5: Cerium Oxide- and Europium Oxide-Doped InZnO Semiconductor Material An MO semiconductor material is obtained by doping cerium oxide as a charge transportation center into InZnO, and doping europium oxide as a carrier control agent to form a cerium oxide- and europium oxide-doped InZnO (Ce—Eu:InZnO) semiconductor material.

MO is ZnO, In:Zn=9:1 mol, which is denoted as In(9) Zn(1); in $In_x Zn_y Eu_n Ce_m O_z$, $x=0.68$, $y=0.0756$, $m=0.1944$, and $n=0.05$. However, the present invention is not limited to the foregoing ratios. In some embodiments, $x=0.7$, $y=0.0778$, $m=0.1722$, $n=0.05$, or, $x=0.75$, $y=0.0833$, $m=0.1167$, $n=0.05$, or, $x=0.8$, $y=0.0889$, $m=0.0611$, $n=0.05$, which will not be repeated herein.

Example 6: Dysprosium Oxide- and Ytterbium Oxide-Doped InZnTaO Semiconductor Material An MO semiconductor material is obtained by doping dysprosium oxide as a charge transportation center into InZnTaO, and doping ytterbium oxide as a carrier control agent to form a dysprosium oxide- and ytterbium oxide-doped InZnTaO (Dy—Yb:InZnTaO) semiconductor material.

MO is ZnTaO, In:Zn:Ta=3:1:0.1 mol, which is denoted as in(3) Zn (1) Ta (0.1); in $In_x(ZnTa)_y Yb_n Dy_m O_z$, $x=0.58$, $y=0.2127$, $m=0.1573$, and $n=0.05$. However, the present invention is not limited to the foregoing ratios. In some embodiments, $x=0.6$, $y=0.22$, $m=0.13$, $n=0.05$, or, $x=0.65$, $y=0.2383$, $m=0.0617$, $n=0.05$, or, $x=0.68$, $y=0.2493$, $m=0.0207$, $n=(0.05$, which will not be repeated herein.

Example 7: Praseodymium Oxide- and Europium Oxide-Doped InSnZnO Thin-Film

An MO semiconductor thin-film is formed through magnetron sputtering of the praseodymium oxide- and europium oxide-doped InSnZnO semiconductor material of example 1.

Example 8: Praseodymium Oxide- and Ytterbium Oxide-Doped InZnTiO Thin-Film

An MO semiconductor thin-film is formed through magnetron sputtering of the praseodymium oxide- and ytterbium oxide-doped InZnTiO semiconductor material of example 2.

Example 9: Terbium Oxide- and Europium Oxide-Doped InGaZnO Thin-Film

An MO semiconductor thin-film is formed through magnetron sputtering of the terbium oxide- and europium oxide-doped InGaZnO semiconductor material of example 3.

Example 10: Terbium Oxide- and Ytterbium Oxide-Doped InGaZrO Thin-Film

An MO semiconductor thin-film is formed through magnetron sputtering of the terbium oxide- and ytterbium oxide-doped InGaZrO semiconductor material of example 4.

Example 11: Cerium Oxide- and Europium Oxide-Doped InZnO Thin-Film

An MO semiconductor thin-film is prepared from the cerium oxide- and europium oxide-doped InZnO semiconductor material of example 5 by using a solution method.

Example 12: Dysprosium Oxide- and Ytterbium Oxide-Doped InZnTaO Thin-Film

An MO semiconductor thin-film is formed through magnetron sputtering of the dysprosium oxide- and ytterbium oxide-doped InZnTaO semiconductor material of example 6.

Example 13: Thin-Film Transistor

A thin-film transistor has a back-channel etch structure, with the schematic structural diagram shown in FIG. 1. The thin-film transistor is provided with a substrate 01, a gate electrode 05 located on the substrate 01, an insulating layer 04 located on the substrate 01 and the gate electrode 05, a channel layer 03 covering the upper surface of the insulating layer 04 and corresponding to the gate electrode 05, a source electrode 07-1 and a drain electrode 07-2 both spaced apart from each other and electrically connected with both ends of the channel layer 03, and a spacer layer 06.

The substrate 01 is a hard alkali-free glass substrate, which is covered with a buffer layer 02 which is silicon oxide.

The gate electrode 05 has a metal molybdenum/copper (Mo/Cu) laminated structure prepared through magnetron sputtering, with a thickness of 20/400 nm.

The insulating layer 04 is a laminated structure of silicon nitride ($Si_3N_4$) and silicon oxide ($SiO_2$) prepared by chemical vapor deposition, with a thickness of 250/50 nm, where the silicon nitride is in contact with the gate electrode 05 at the lower layer and the silicon oxide is in contact with the channel layer 03 at the upper layer.

To test the impact of different praseodymium oxide content on device performance, the channel layer 03 is made of the praseodymium oxide- and europium oxide-doped InSnZnO semiconductor material of example 1. Three ceramic targets, InSnZnO, europium oxide-doped InSnZnO (Eu:InSnZnO) and praseodymium oxide- and europium oxide-doped InSnZnO (Pr—Eu:InSnZnO), are used to prepare thin-films with different ingredient ratios through co-sputtering of a single or two targets and by adjusting the sputtering power of the two targets.

The source electrode 07-1 and the drain electrode 07-2 have a metal molybdenum/copper (Mo/Cu) laminated structure with a thickness of 20/400 nm. The source electrode 07-1 and the drain electrode 07-2 are patterned with a commercial hydrogen peroxide-based etchant, which has less damage to the channel layer 03 and no obvious etching residue.

The spacer layer 06 is made of silicon oxide ($SiO_2$) prepared by chemical vapor deposition with a thickness of 300 nm and a deposition temperature of 250° C.

The thin-film transistor of this embodiment may have a closed structure including only a substrate 01, a gate electrode 05, an insulating layer 04, a channel layer 03, a source electrode 07-1, a drain electrode 07-2, and a spacer layer 06, may further include a planarization layer, a reflective electrode, a pixel definite layer, etc., and may further be integrated with other devices.

The patterning process of the thin-film is implemented by photolithography combined with wet or dry etching.

In this embodiment, the specific parameters and the performance of the prepared thin-film transistor device are shown in Table 1. The characterization mode of photo-current characteristics is to irradiate the channel layer 03 of the thin-film transistor device with a commercial white LED light source (the light intensity is set to 10000 nits), evaluate the transfer characteristics of the device under illumination and under no illumination, and extract changes of threshold voltage and subthreshold swing, etc. of the device to evaluate the strength of the characteristics. When the variation range of the threshold voltage is large, it indicates that the photo-current characteristics are strong, and when the variation range of the threshold voltage is small, the photo-current characteristics are weak.

| Test | | 1 | 2 | 3 | 4 | 5 | 6 | 7 | 8 |
|---|---|---|---|---|---|---|---|---|---|
| Praseodymium atom content | m | 0 | 0 | 0.0001 | 0.0010 | 0.0100 | 0.0500 | 0.1000 | 0.1500 |
| Europium atom content | n | 0 | 0.0500 | | | 0.0500 | | | |
| Deposition conditions of the channel layer | Deposition mode | | | | Magnetron sputtering | | | | |
| | $O_2/(Ar + O_2)$ (%) | | | | 20 | | | | |
| | Sputtering pressure (Pa) | | | | 0.5 | | | | |
| | Substrate temperature (° C.) | | | | RT | | | | |
| Channel layer treatment | Atmosphere annealing treatment | | | | Air-350° C. | | | | |
| Composition of other film layers | Substrate | | | | Glass | | | | |
| | Buffer Layer | | | | $SiO_2$ | | | | |

-continued

| | Test | 1 | 2 | 3 | 4 | 5 | 6 | 7 | 8 |
|---|---|---|---|---|---|---|---|---|---|
| | Gate electrode | | | | Mo/Cu | | | | |
| | Gate insulating layer | | | | $Si_3N_4/SiO_2$ | | | | |
| | Source electrode and drain electrode | | | | Mo/Cu | | | | |
| | Spacer layer | | | | $SiO_2$ | | | | |
| Spacer layer post-treatment | Atmosphere annealing treatment | | | | Air-300° C. | | | | |
| Thin-film properties | Carrier concentration n ($cm^{-3}$) | 5.00E+19 | 4.20E+18 | 4.00E+18 | 3.50E+18 | 2.80E+18 | 8.40E+17 | 3.10E+17 | 8.00E+16 |
| Device performance | Threshold voltage $V_{th}$ (V) | / | −5.3 | −4.8 | −4.2 | −1.4 | 0.2 | 2.6 | 4.1 |
| | Mobility μ ($cm^2V^{-1}s^{-1}$) | / | 40.6 | 38.4 | 34.8 | 30.5 | 25.7 | 12.2 | 3.5 |
| | Subthreshold swing SS (V/decade) | / | 0.14 | 0.14 | 0.16 | 0.18 | 0.25 | 0.34 | 0.46 |
| | Current on/off ratio $I_{on}/I_{off}$ | / | $10^9$ | $10^9$ | $10^9$ | $10^9$ | $10^9$ | $10^8$ | $10^7$ |
| | Electrical stability | / | Poor | Relatively poor | Good | Excellent | Excellent | Excellent | Excellent |
| | Photo-current characteristics | / | Extremely strong | Strong | Relatively strong | Weak | Weak | Weak | Weak |

Note:
MO in this embodiment is SnZnO, where In/Sn/Zn = 3/1/1(mol), and "/" indicates that the device has no on-off characteristics.

It can be seen from Table 1 that the doping of praseodymium oxide and europium oxide has a very obvious impact on the device performance. First, as shown in Test 1 of Table 1, the device prepared from InSnZnO without praseodymium oxide (m=0) and europium oxide (n=0) does not show the "on-off" characteristics (on-state) of a thin-film transistor, which indicates that the carrier concentration in the thin-film is too high. As shown in Test 2 of Table 1, after doping of a certain amount of europium oxide (corresponding to m=0, n=0.05), the device shows "on-off" characteristics, with details shown in FIG. 4(a), which indicates that the doping of europium oxide can effectively suppress the carrier concentration in the thin-film, and corresponding Hall data of the thin-film is shown in Table 1. Further, as shown in Tests 2-8 in Table 1, a series of devices with different praseodymium content can be prepared by adjusting the sputtering power of targets in co-sputtering. It should be noted that the device not doped with praseodymium oxide (corresponding to m=0, n=0.05) has relatively high mobility, small subthreshold swing and negative threshold voltage, but its photo-current characteristics are extremely strong. That is, the device characteristics change obviously under the condition of light irradiation (the threshold voltage shifts negatively and the subthreshold swing degrades seriously). However, after the doping of a certain amount of praseodymium oxide, the photo-current characteristics of the device are obviously inhibited. Certainly, with the increase of the praseodymium oxide content, the mobility and other characteristics of the device are further degraded, and the photo-current characteristics are further improved. After excessive praseodymium oxide is doped (for example, m=0.15, n=0.05), the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 4:
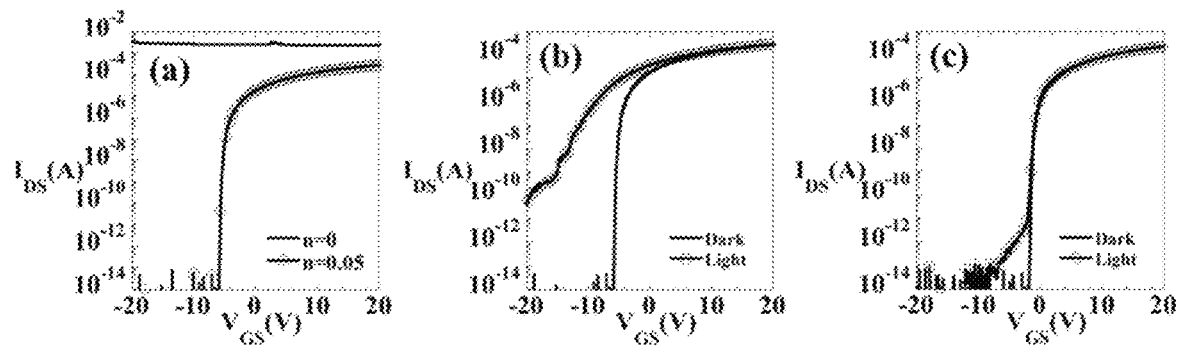
FIG. 4 is a device transfer characteristics and photo-current characteristic diagram of example 13.

The corresponding photo-current characteristics of the device prepared in this embodiment are tested. As shown in FIG. 4(b) and FIG. 4(c), the corresponding m values are 0 and 0.05, respectively. When light irradiates on the device, the threshold voltage of the device (corresponding to m=0, n=0.05) not doped with praseodymium oxide shifts significantly negatively, and the subthreshold swing is seriously degraded. Ater a certain amount of praseodymium oxide is doped (corresponding to m=0.05, n=0.05), the threshold voltage of the device has almost no change. The device shows excellent illumination stability, which corresponds to the weak photo-current characteristics in Table 1.

The test results of this embodiment show that doping a certain amount of praseodymium oxide and europium oxide into the InSnZnO basis material can effectively control the carrier concentration of the material and improve illumination stability.

Example 14: Thin-Film Transistor

A thin-film transistor has a back-channel etch structure, with the schematic structural diagram shown in FIG. 1. The thin-film transistor is provided with a substrate 01, a gate electrode 05 located on the substrate 01, an insulating layer 04 located on the substrate 01 and the gate electrode 05, a channel layer 03 covering the upper surface of the insulating layer 04 and corresponding to the gate electrode 05, a source electrode 07-1 and a drain electrode 07-2 both spaced apart from each other and electrically connected with both ends of the channel layer 03, and a spacer layer 06.

The substrate 01 is a hard alkali-free glass substrate, which is covered with a buffer layer 02 which is silicon oxide.

The gate electrode 05 has a metal molybdenum/copper (Mo/Cu) laminated structure prepared through magnetron sputtering, with a thickness of 20/400 nm.

The insulating layer 04 is a laminated structure of silicon nitride ($Si_3N_4$) and silicon oxide ($SiO_2$) prepared by chemical vapor deposition, with a thickness of 250/50 nm, where the silicon nitride is in contact with the gate electrode 05 at the lower layer and the silicon oxide is in contact with the channel layer 03 at the upper layer.

To test the impact of different ytterbium oxide content on device performance, the channel layer 03 is made of the praseodymium oxide- and ytterbium oxide-doped InZnTiO semiconductor material of example 2. Three ceramic targets, InZnTiO, praseodymium oxide-doped InSnZnO (Pr:InZnTiO) and praseodymium oxide- and ytterbium oxide-doped InZnTiO (Pr—Yb:InZnTiO), are used to prepare thin-films with different ingredient ratios through co-sputtering of a single or two targets and by adjusting the sputtering power of the two targets.

The source electrode 07-1 and the drain electrode 07-2 have a metal molybdenum/copper (Mo/Cu) laminated structure with a thickness of 20/400 nm. The source electrode 07-1 and the drain electrode 07-2 are patterned with a commercial hydrogen peroxide-based etchant, which has less damage to the channel layer 03 and no obvious etching residue.

The thin-film transistor of this embodiment may have a closed structure including only a substrate 01, a gate electrode 05, an insulating layer 04, a channel layer 03, a source electrode 07-1, a drain electrode 07-2, and a spacer layer 06, may further include a planarization layer, a reflective electrode, a pixel definite layer, etc., and may further be integrated with other devices.

The patterning process of the thin-film is implemented by photolithography combined with wet or dry etching.

In this embodiment, the specific parameters and the performance of the prepared thin-film transistor device are shown in Table 2. The characterization mode of photo-current characteristics is to irradiate the channel layer 03 of the thin-film transistor device with a commercial white LED light source (the light intensity is set to 1000 nits), evaluate the transfer characteristics of the device under illumination and under no illumination, and extract changes of threshold voltage and subthreshold swing, etc. of the device to evaluate the strength of the characteristics. When the variation range of the threshold voltage is large, it indicates that the photo-current characteristics are strong, and when the variation range of the threshold voltage is small, the photo-current characteristics are weak.

| Test | | 1 | 2 | 3 | 4 | 5 | 6 | 7 | 8 |
|---|---|---|---|---|---|---|---|---|---|
| Praseodymium atom content | m | 0 | 0.0500 | | | 0.0500 | | | |
| Ytterbium atom content | n | 0 | 0 | 0.0001 | 0.0010 | 0.0100 | 0.0500 | 0.1000 | 0.1500 |
| Deposition conditions of the channel layer | Deposition mode | | | | Magnetron sputtering | | | | |
| | $O_2/(Ar + O_2)$ (%) | | | | 30 | | | | |
| | Sputtering pressure (Pa) | | | | 0.3 | | | | |
| | Substrate temperature (° C.) | | | | RT | | | | |
| Channel layer treatment | Atmosphere annealing treatment | | | | Air-350° C. | | | | |
| Composition of other film layers | Substrate | | | | Glass | | | | |
| | Buffer layer | | | | $SiO_2$ | | | | |
| | Gate electrode | | | | Mo/Cu | | | | |
| | Gate insulating layer | | | | $Si_3N_4/SiO_2$ | | | | |
| | Source electrode and drain electrode | | | | Mo/Cu | | | | |
| | Spacer layer | | | | $SiO_2$ | | | | |
| Spacer layer post-treatment | Atmosphere annealing treatment | | | | Air-300° C. | | | | |
| Thin-film properties | Carrier concentration n (cm$^{-3}$) | 3.30E+19 | 2.10E+19 | 9.30E+18 | 7.50E+18 | 5.20E+18 | 8.50E+17 | 2.40E+17 | 6.60E+17 |
| Device performance | Threshold voltage $V_{th}$ (V) | / | / | −15.8 | −6.2 | −1.2 | 0.5 | 2.8 | 5.2 |
| | Mobility μ (cm$^2$V$^{-1}$s$^{-1}$) | / | / | 56.3 | 48.6 | 36.2 | 30.7 | 15.2 | 6.5 |
| | Subthreshold swing SS (V/decade) | / | / | 0.34 | 0.14 | 0.19 | 0.23 | 0.36 | 0.53 |
| | Current on/off ratio $I_{on}/I_{off}$ | / | / | $10^8$ | $10^9$ | $10^9$ | $10^9$ | $10^8$ | $10^7$ |
| | Electrical stability | / | / | Relatively poor | Poor | Excellent | Excellent | Excellent | Excellent |
| | Photo-current Characteristics | / | / | Weak | Weak | Weak | Weak | Weak | Weak |

Note:
MO in this embodiment is ZnTiO, where In/Zn/Ti = 4/1/0.05 (mol), and "/" indicates that the device has no on-off characteristics.

The spacer layer 06 is made of silicon oxide ($SiO_2$) prepared by chemical vapor deposition with a thickness of 300 nm and a deposition temperature of 250° C.

It can be seen from Table 2 that the doping of praseodymium oxide and ytterbium oxide has a very obvious impact on the device performance. First, as shown in Test 1 of Table 2, the device prepared from InZnTiO without praseodymium oxide (m=0) and ytterbium oxide (n=0) does not show the "on-off" characteristics (on-state) of a thin-film transistor, which indicates that the carrier concentration in the thin-film is too high. As shown in Test 2 of Table 2, after doping of a certain amount (corresponding to m=0.05, n=) of praseodymium oxide, the device still does not show "on-off" characteristics; further, when a certain amount of ytterbium oxide continues to be doped (corresponding to m=0.05, n=0.0001), the device shows "on-off" characteristics. It indicates that the suppression effect of praseodymium oxide on the carrier concentration in thin-films is not as obvious as that of ytterbium oxide, and corresponding Hall data of the thin-films is shown in Table 2. To further study the impact of ytterbium oxide, as shown in Tests 2-8 in Table 2, a series of devices with different ytterbium content can be prepared by adjusting the sputtering power of targets in co-sputtering. Specifically, devices doped with a small amount of ytterbium oxide (corresponding to m=0.05, n=0.0001) have relatively high mobility and negative threshold voltage. With the increase of ytterbium oxide content, the threshold voltage of the device shifts positively and the mobility decreases. It shows that ytterbium oxide can effectively control the threshold voltage of the devices, that is, ytterbium oxide effectively controls the carrier concentration in thin-films, which can be further verified from Hall data in Table 2. Certainly, after excessive ytterbium oxide is doped (for example, m=0.05, n=0.15), the mobility of the device is obviously degraded. This greatly limits its application fields. Therefore, in practical application, it is necessary to weigh the relationship between the two and select the appropriate doping amount.

Figure 5:
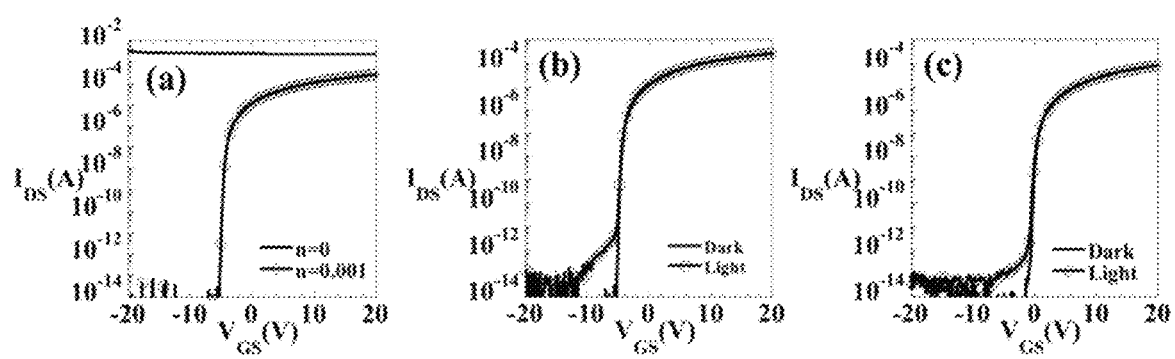
FIG. 5 is a device transfer characteristics and photo-current characteristic diagram of example 14.

The corresponding photo-current characteristics of the device prepared in this embodiment are tested. As shown in FIG. 5(b) and FIG. 5(c), the corresponding m values are 0.05, and n values are 0.001 and 0.05 respectively. When light irradiates on the device, the threshold voltage of the device (corresponding to m=0.05, n=0.001) doped with a small amount of ytterbium oxide does not shift significantly, and the subthreshold swing is slightly degraded. In addition, after a certain amount of ytterbium oxide is doped (corresponding to m=0.05, n=0.05), the threshold voltage of the device also has almost no change. The device shows excellent illumination stability, which corresponds to the weak photo-current characteristics in Table 2. It should be noted that the photo-current characteristics of devices with different ytterbium content (m=0.05, n=0-0.15) are weak, which indicates that the doping of praseodymium oxide can effectively improve the illumination stability of the devices.

The test results of this embodiment show that doping a certain amount of praseodymium oxide and ytterbium oxide into the InZnTiO basis material can effectively control the carrier concentration of the material and improve illumination stability.

Example 15: Thin-Film Transistor

Figure 2:
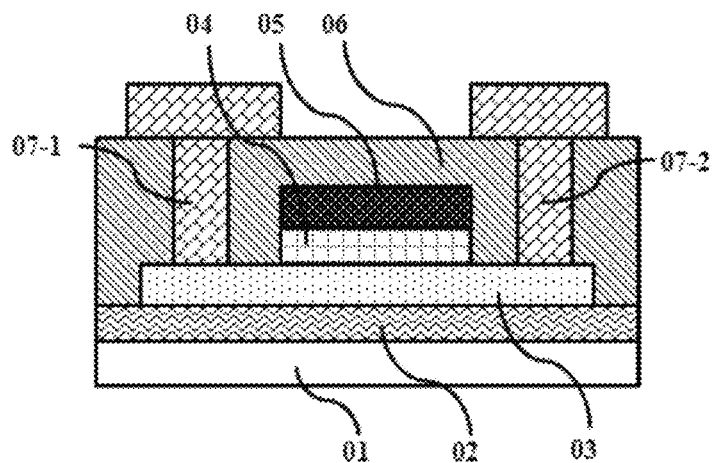
FIG. 2 is a schematic structural diagram of a thin-film transistor of example 15, example 16 and example 17.

A thin-film transistor has a top-gate self-alignment structure, with the schematic structural diagram shown in FIG. 2.

The thin-film transistor is provided with a substrate 01, a buffer layer 02, a channel layer 03, an insulating layer 04 and a gate electrode 05 both located on the channel layer 03, a spacer layer 06 covering the channel layer 03 and the upper surface of the gate electrode, and a source electrode 07-1 and a drain electrode 07-2 both located on the spacer layer 06 and electrically connected with both ends of the channel layer 03.

The substrate 01 is a hard glass substrate.

The buffer layer 02 is silicon oxide prepared by plasma-enhanced chemical vapor deposition.

The channel layer 03 is made of the terbium oxide- and europium oxide-doped InGaZnO semiconductor material of example 3, with a thickness of 30 nm.

The insulating layer 04 is silicon oxide with a thickness of 300 nm. The gate electrode 05 has a titanium/copper (Ti/Cu) laminated structure prepared through magnetron sputtering, with a thickness of 20/400 nm.

The spacer layer 06 is silicon oxide with a thickness of 300 nm.

The source electrode 07-1 and the drain electrode 07-2 each have a titanium/copper (Ti/Cu) laminated structure prepared through magnetron sputtering, with a thickness of 20/400 nm.

To test the impact of different ytterbium content on device performance, the channel layer 03 is made of the terbium oxide- and europium oxide-doped InGaZnO semiconductor material of example 3. Three ceramic targets, InGaZnO, terbium oxide-doped InGaZnO (Tb:InGaZnO) and terbium oxide- and europium oxide-doped InGaZnO (Tb—Eu:InGaZnO), are used to prepare thin-films with different ingredient ratios through co-sputtering of a single or two targets and by adjusting the sputtering power of the two targets.

The thin-film transistor of this embodiment may have a closed structure including only a substrate 01, a channel layer 03, an insulating layer 04, a gate electrode 05, a spacer layer 06, a source electrode 07-1 and a drain electrode 07-2, may further include a passivation layer, a pixel definite layer, etc., and may further be integrated with other devices.

The patterning of the thin-film is implemented by photo-lithography combined with wet or dry etching.

In this embodiment, the specific parameters and the performance of the prepared thin-film transistor device are shown in Table 3. The characterization mode of photo-current characteristics is to irradiate the channel layer of the thin-film transistor device with a commercial white LED light source, characterize the transfer characteristics of the device under different light intensity conditions, and extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

| Test | | 1 | 2 | 3 | 4 | 5 | 6 | 7 | 8 |
|---|---|---|---|---|---|---|---|---|---|
| Terbium atom content | m | 0 | 0.0500 | | | 0.0500 | | | |
| Europium atom content | n | 0 | 0 | 0.0001 | 0.0010 | 0.0100 | 0.0500 | 0.1000 | 0.1500 |
| Deposition conditions of the channel layer | Deposition mode | | | | Magnetron sputtering | | | | |
| | $O_2/(Ar + O_2)$ (%) | | | | 20 | | | | |

-continued

| | Test | 1 | 2 | 3 | 4 | 5 | 6 | 7 | 8 |
|---|---|---|---|---|---|---|---|---|---|
| Channel layer treatment | Sputtering pressure (Pa) | | | | 0.3 | | | | |
| | Substrate temperature (° C.) | | | | RT | | | | |
| | Atmosphere annealing treatment | | | | Air-350° C. | | | | |
| Composition of other film layers | Substrate | | | | Glass | | | | |
| | Buffer layer | | | | $Si_3N_4/SiO_2$ | | | | |
| | Gate insulating layer | | | | SiO2 | | | | |
| | Gate electrode | | | | Ti/Cu | | | | |
| | Spacer layer | | | | $SiO_2$ | | | | |
| | Source electrode and drain electrode | | | | Ti/Cu | | | | |
| Spacer layer post-treatment | Atmosphere annealing treatment | | | | Air-300° C. | | | | |
| Thin-film properties | Carrier concentration n ($cm^{-3}$) | 2.60E+19 | 1.00E+19 | 9.10E+18 | 5.00E+18 | 1.20E+18 | 5.40E+17 | 8.30E+16 | 2.02E+16 |
| Device performance | Threshold voltage $V_{th}$ (V) | / | / | −14.8 | −5.2 | −0.6 | −0.8 | 3.6 | 6.4 |
| | Mobility μ ($cm^2V^{-1}s^{-1}$) | / | / | 56.3 | 36.8 | 26.3 | 20.2 | 8.2 | 1.5 |
| | Subthreshold swing SS (V/decade) | / | / | 0.43 | 0.22 | 0.29 | 0.33 | 0.38 | 0.55 |
| | Current on/off ratio $I_{on}/I_{off}$ | / | / | $10^8$ | $10^9$ | $10^9$ | $10^9$ | $10^8$ | $10^7$ |
| | Electrical stability | / | / | Relatively poor | Poor | Excellent | Excellent | Excellent | Excellent |
| | Photo-current Characteristics | / | / | Weak | Weak | Weak | Weak | Weak | Weak |

Note:
MO in this embodiment is GaZnO, where In/GA/Zn = 4/0.5/1 (mol), and "/" indicates that the device has no on-off characteristics.

Figure 6:
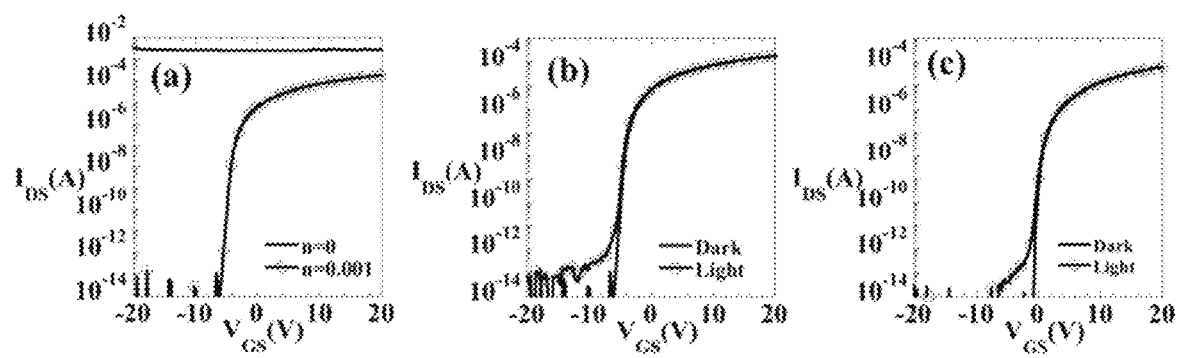
FIG. 6 is a device transfer characteristics and photocurrent characteristic diagram of example 15.

It can be seen from Table 3 that the doping of terbium oxide and europium oxide has a very obvious impact on the device performance. First, as shown in Test 1 of Table 3, the device prepared from InGaZnO without terbium oxide (m=0) and europium oxide (n=0) does not show the "on-off" characteristics (on-state) of a thin-film transistor, which indicates that the carrier concentration in the thin-film is too high. As shown in Test 2 of Table 3, after doping of a certain amount (corresponding to m=0.05, n=0) of terbium oxide, the device still does not show "on-off" characteristics; further, when a certain amount of europium oxide continues to be doped (corresponding to m=0.05, n=0.0001), the device shows "on-off" characteristics. It indicates that the suppression effect of terbium oxide on the carrier concentration in thin-films is not as obvious as that of europium oxide, and corresponding Hall data of the thin-films are shown in Table 3. To further study the impact of europium oxide, as shown in Tests 2-8 in Table 3, a series of devices with different europium content can be prepared by adjusting the sputtering power of targets in co-sputtering. Specifically, devices doped with as mall amount of europium oxide (corresponding to m=0.05, n-=0.001) have relatively high mobility and negative threshold voltage. With the increase of europium oxide content, the threshold voltage of the device shifts positively and the mobility decreases. It shows that europium oxide can effectively control the threshold voltage of the devices, that is, europium oxide effectively controls the carrier concentration in thin-films, which can be further verified from Hall data in Table 3. Certainly, after excessive europium oxide is doped (for example, m=0.05, n=0.15), the mobility of the device is obviously degraded. This greatly limits its application fields. Therefore, in practical application, it is necessary to weigh the relationship between the two and select the appropriate doping amount. The corresponding photo-current characteristics of the device prepared in this embodiment are tested. As shown in FIG. 6(b) and FIG. 6(c), the corresponding m values are 0.05, and n values are 0.001 and 0.05 respectively. When light irradiates on the device, the threshold voltage of the device (corresponding to m=0.05, n=0.001) doped with a small amount of europium oxide does not shift significantly, and the subthreshold swing is slightly degraded. In addition, after a certain amount of europium oxide is doped (corresponding to m=0.05, n=0.05), the threshold voltage of the device also has almost no change. The device shows excellent illumination stability, which corresponds to the weak photo-current characteristics in Table 3. It should be noted that the photo-current characteristics of devices with different europium content (m=0.05, n=0-0.15) are weak, which indicates that the doping of terbium oxide can effectively improve the illumination stability of the devices.

The test results of this embodiment show that doping a certain amount of terbium oxide and europium oxide into the InGaZnO basis material can effectively control the carrier concentration of the material and improve illumination stability.

Example 16: Thin-Film Transistor

A thin-film transistor has a top-gate self-alignment structure, with the schematic structural diagram shown in FIG. 2. The thin-film transistor is provided with a substrate 01, a buffer layer 02, a channel layer 03, an insulating layer 04 and a gate electrode 05 both located on the channel layer 03, a spacer layer 06 covering the channel layer 03 and the upper surface of the gate electrode, and a source electrode 07-1 and a drain electrode 07-2 both located on the spacer layer 06 and electrically connected with both ends of the channel layer 03.

The substrate 01 is a hard glass substrate.

The buffer layer 02 is silicon oxide prepared by plasma-enhanced chemical vapor deposition.

The channel layer 03 is made of the terbium oxide- and ytterbium oxide-doped InGaZrO semiconductor material of example 4, with a thickness of 30 nm.

The insulating layer 04 is silicon oxide with a thickness of 300 nm. The gate electrode 05 has a titanium/copper (Ti/Cu) laminated structure prepared through magnetron sputtering, with a thickness of 20/400 nm.

The spacer layer 06 is silicon oxide with a thickness of 300 nm.

The source electrode 07-1 and the drain electrode 07-2 each have a titanium/copper (Ti/Cu) laminated structure prepared through magnetron sputtering, with a thickness of 20/400 nm.

To test the impact of different terbium content on device performance, the channel layer 03 is made of the terbium oxide- and ytterbium oxide-doped InGaZrO semiconductor material of example 4. Three ceramic targets, InGaZrO, terbium oxide-doped InGaZnO (Tb:InGaZrO) and terbium oxide- and ytterbium oxide-doped InGaZnO (Tb—Yb:In-GaZrO), are used to prepare thin-films with different ingredient ratios through co-sputtering of a single or two targets and by adjusting the sputtering power of the two targets.

The thin-film transistor of this embodiment may have a closed structure including only a substrate 01, a channel layer 03, an insulating layer 04, a gate electrode 05, a spacer layer 06, a source electrode 07-1 and a drain electrode 07-2, may further include a passivation layer, a pixel definite layer, etc., and may further be integrated with other devices.

The patterning of the thin-film is implemented by photo-lithography combined with wet or dry etching.

In this embodiment, the specific parameters and the performance of the prepared thin-film transistor device are shown in Table 4. The characterization mode of photo-current characteristics is to irradiate the channel layer 03 of the thin-film transistor device with a commercial white LED light source, characterize the transfer characteristics of the device under different light intensity conditions, and extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

| Test | | 1 | 2 | 3 | 4 | 5 | 6 | 7 | 8 |
|---|---|---|---|---|---|---|---|---|---|
| Terbium atom content | m | 0 | 0 | 0.0001 | 0.0010 | 0.0100 | 0.0500 | 0.1000 | 0.1500 |
| Ytterbium atom content | n | 0 | 0.0500 | | | 0.0500 | | | |
| Deposition conditions of the channel layer | Deposition mode | Magnetron sputtering | | | | | | | |
| | $O_2/(Ar + O_2)$ (%) | 30 | | | | | | | |
| | Sputtering pressure (Pa) | 0.5 | | | | | | | |
| | Substrate temperature (° C.) | RT | | | | | | | |
| Channel layer treatment | Atmosphere annealing treatment | Air-350° C. | | | | | | | |
| Composition of other film layers | Substrate | Glass | | | | | | | |
| | Buffer layer | $Si_3N_4/SiO_2$ | | | | | | | |
| | Gate insulating layer | SiO2 | | | | | | | |
| | Gate electrode | Ti/Cu | | | | | | | |
| | Spacer layer | $SiO_2$ | | | | | | | |
| | Source electrode and drain electrode | Ti/Cu | | | | | | | |
| Spacer layer post-treatment | Atmosphere annealing treatment | Air-300° C. | | | | | | | |
| Thin-film properties | Carrier concentration n ($cm^{-3}$) | 8.00E+19 | 7.20E+18 | 7.00E+18 | 6.50E+18 | 4.80E+18 | 1.20E+18 | 5.10E+17 | 8.50E+16 |
| Device performance | Threshold voltage $V_{th}$ (V) | / | −6.3 | −5.8 | −5.2 | −2.4 | 0.1 | 1.6 | 3.1 |
| | Mobility μ ($cm^2V^{-1}s^{-1}$) | / | 45.6 | 40.5 | 38.8 | 32.5 | 28.7 | 14.2 | 6.5 |
| | Subthreshold swing SS (V/decade) | / | 0.12 | 0.12 | 0.13 | 0.15 | 0.24 | 0.32 | 0.45 |
| | Current on/off ratio ratio $I_{on}/I_{off}$ | / | $10^9$ | $10^9$ | $10^9$ | $10^9$ | $10^9$ | $10^8$ | $10^7$ |
| | Electrical stability | / | Poor | Relatively poor | Good | Excellent | Excellent | Excellent | Excellent |
| | Photo-current Characteristics | / | Extremely strong | Strong | Relatively strong | Weak | Weak | Weak | Weak |

Note:
MO in this embodiment is GaZrO, where In/Ga/Zr = 5/1/0.05 (mol), and "/" indicates that the device has no on-off characteristics.

It can be seen from Table 4 that the doping of terbium oxide and ytterbium oxide has a very obvious impact on the device performance. First, as shown in Test 1 of Table 4, the device prepared from InGaZrO without terbium oxide (m=0) and ytterbium oxide (n=0) does not show the "on-off" characteristics (on-state) of a thin-film transistor, which indicates that the carrier concentration in the thin-film is too high. As shown in Test 2 of Table 4, after doping of a certain amount of ytterbium oxide (corresponding to m=0, n=0.05), the device shows "on-off" characteristics, with details shown in FIG. 7(a), which indicates that the doping of ytterbium oxide can effectively suppress the carrier concentration in the thin-film, and corresponding Hall data of the thin-film is shown in Table 4. Further, as shown in Tests 2-8 in Table 4, a series of devices with different terbium content can be prepared by adjusting the sputtering power of targets in co-sputtering. It should be noted that the device not doped with terbium oxide (corresponding to m=0, n=0.05) has relatively high mobility, small subthreshold swing and negative threshold voltage, but its photo-current characteristics are extremely strong. That is, the device characteristics change obviously under the condition of light irradiation (the threshold voltage shifts negatively and the subthreshold swing degrades seriously). However, after the doping of a certain amount of terbium oxide, the photo-current characteristics of the device are obviously inhibited. Certainly, with the increase of the terbium oxide content, the mobility and other characteristics of the device are further degraded, and the photo-current characteristics are further improved. After excessive terbium oxide is doped (for example, m=0.15, n=0.05), the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 7:
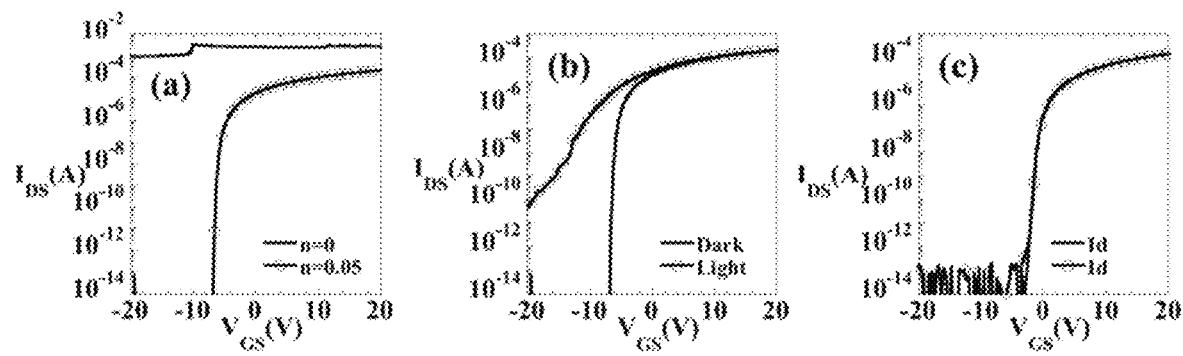
FIG. 7 is a device transfer characteristics and photocurrent characteristic diagram of example 16.

The corresponding photo-current characteristics of the device prepared in this embodiment are tested. As shown in FIG. 7(b) and FIG. 7(c), the corresponding n values are 0.05, and m values are 0 and 0.05 respectively. When light irradiates on the device, the threshold voltage of the device (corresponding to m=0, n=0.05) without terbium oxide shifts negatively significantly, and the subthreshold swing is seriously degraded. In addition, after a certain amount of terbium oxide is doped (corresponding to m=0.05, n=0.05), the threshold voltage of the device has almost no change. The device shows excellent illumination stability, which corresponds to the weak photo-current characteristics in Table 4.

The test results of this embodiment show that doping a certain amount of terbium oxide and ytterbium oxide into the InGaZrO basis material can effectively control the carrier concentration of the material and improve illumination stability.

Example 17: Thin-Film Transistor

A thin-film transistor has a self-alignment structure, with the schematic structural diagram shown in FIG. 2. The thin-film transistor is provided with a substrate 01, a buffer layer 02, a channel layer 03, an insulating layer 04 and a gate electrode 05 both located on the channel layer 03, a spacer layer 06 covering the channel layer 03 and the upper surface of the gate electrode 05, and a source electrode 07-1 and a drain electrode 07-2 both located on the spacer layer 06 and electrically connected with both ends of the channel layer 03.

The substrate 01 is a hard glass substrate.

The buffer layer 02 is silicon oxide prepared by plasma-enhanced chemical vapor deposition.

The channel layer 03 is made of the cerium oxide- and europium oxide-doped InZnO semiconductor material of example 5, with a thickness of 20 nm.

The insulating layer 04 is silicon oxide with a thickness of 300 nm. The gate electrode 05 has a molybdenum/copper/molybdenum (Mo/Cu/Mo) laminated structure prepared through magnetron sputtering, with a thickness of 20/400/50 nm.

The spacer layer 06 is a silicon oxide thin-film prepared by plasma-enhanced chemical vapor deposition, with a thickness of 300 nm.

The source electrode 07-1 and the drain electrode 07-2 each have a molybdenum/copper/molybdenum (Mo/Cu/Mo) laminated structure prepared through magnetron sputtering, with a thickness of 20/400/50 nm.

The thin-film transistor of this embodiment may have a closed structure including only a substrate 01, a channel layer 03, an insulating layer 04, a gate electrode 05, a spacer layer 06, a source electrode 07-1 and a drain electrode 07-2, may further include a passivation layer, a pixel definite layer, etc., and may further be integrated with other devices.

The patterning of the thin-film is implemented by photolithography combined with wet or dry etching.

In this embodiment, the specific parameters and the performance of the prepared thin-film transistor device are shown in Table 5. The characterization mode of photo-current characteristics is to irradiate the channel layer 03 of the thin-film transistor device with a commercial white LED light source, characterize the transfer characteristics of the device under different light intensity conditions, and extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

| Test | | 1 | 2 | 3 | 4 | 5 | 6 | 7 | 8 |
|---|---|---|---|---|---|---|---|---|---|
| Cerium atom content | m | 0 | 0 | 0.0001 | 0.0010 | 0.0100 | 0.0500 | 0.1000 | 0.1500 |
| Europium atom content | n | 0 | 0.0500 | | | 0.0500 | | | |
| Deposition conditions of the channel layer | Deposition mode | | | | Solution method | | | | |
| | Prebaking temperature (° C.) | | | | 120 | | | | |
| Channel layer treatment | Post-annealinguring temperature (° C.) | | | | 400 | | | | |
| Composition of other film layers | Substrate | | | | Glass | | | | |
| | Buffer layer | | | | SiO$_2$ | | | | |
| | Gate insulating layer | | | | SiO2 | | | | |

-continued

| Test | | 1 | 2 | 3 | 4 | 5 | 6 | 7 | 8 |
|---|---|---|---|---|---|---|---|---|---|
| | Gate electrode | | | | Mo/Cu/Mo | | | | |
| | Spacer layer | | | | $SiO_2$ | | | | |
| | Source electrode and drain electrode | | | | Mo/Cu/Mo | | | | |
| Spacer layer post-treatment | Atmosphere annealing treatment | | | | CDA-300° C. | | | | |
| Thin-film properties | Carrier concentration n ($cm^{-3}$) | 5.00E+19 | 4.20E+18 | 4.00E+18 | 3.50E+18 | 2.80E+18 | 8.00E+17 | 3.10E+17 | 8.40E+16 |
| Device performance | Threshold voltage $V_{th}$ (V) | / | −4.2 | −4.1 | −3.5 | −2.3 | 0.5 | 2.0 | 3.2 |
| | Mobility μ ($cm^2V^{-1}s^{-1}$) | / | 52.3 | 50.6 | 48.23 | 35.4 | 28.1 | 19.7 | 8.3 |
| | Subthreshold swing SS (V/decade) | / | 0.11 | 0.11 | 0.12 | 0.13 | 0.29 | 0.34 | 0.48 |
| | Current on/off ratio $I_{on}/I_{off}$ | / | $10^9$ | $10^9$ | $10^9$ | $10^9$ | $10^9$ | $10^8$ | $10^8$ |
| | Electrical stability | / | Poor | Relatively poor | Good | Excellent | Excellent | Excellent | Excellent |
| | Photo-current characteristics | / | Extremely strong | Strong | Relatively strong | Weak | Weak | Weak | Weak |

Note:
MO in this embodiment is ZnO, where In/Zn = 9/1, and "/" indicates that the device has no on-off characteristics.

It can be seen from Table 5 that the doping of cerium oxide and europium oxide has a very obvious impact on the device performance. First, as shown in Test 1 of Table 5, the device prepared from InZnO without cerium oxide (m=0) and europium oxide (n=0) does not show the "on-off" characteristics (on-state) of a thin-film transistor, which indicates that the carrier concentration in the thin-film is too high. As shown in Test 2 of Table 5, after doping of a certain amount of europium oxide (corresponding to m=0, n=0.05), the device shows "on-off" characteristics, with details shown in FIG. 8(a), which indicates that the doping of europium oxide can effectively suppress the carrier concentration in the thin-film, and corresponding Hall data of the thin-film is shown in Table 5. Further, as shown in Tests 2-8 in Table 5, a series of devices with different cerium content can be prepared by adjusting the components in the prepared solution. It should be noted that the device not doped with cerium oxide (corresponding to m=0, n=0.05) has relatively high mobility, small subthreshold swing and negative threshold voltage, but its photo-current characteristics are extremely strong. That is, the device characteristics change obviously under the condition of light irradiation (the threshold voltage shifts negatively and the subthreshold swing degrades seriously). However, after the doping of a certain amount of cerium oxide, the photo-current characteristics of the device are obviously inhibited. Certainly, with the increase of the cerium oxide content, the mobility and other characteristics of the device are further degraded, and the photo-current characteristics are further improved. After excessive cerium oxide is doped (for example, m=0.15, n=0.05), the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 8:
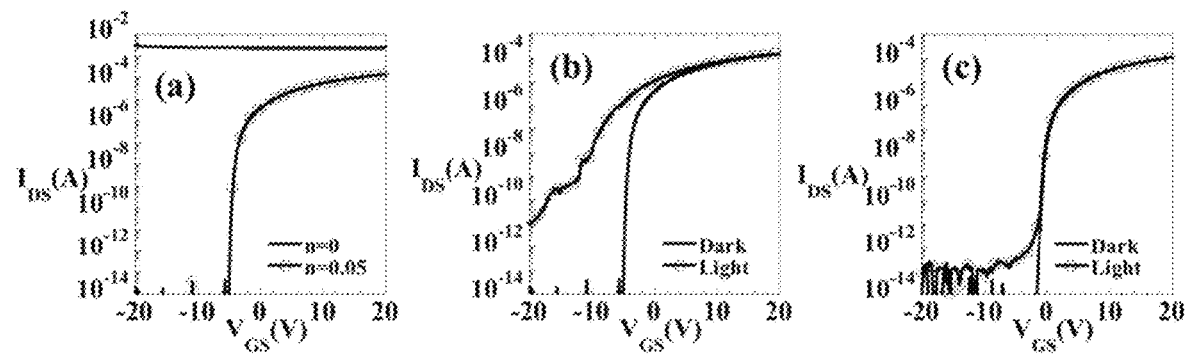
FIG. 8 is a device transfer characteristics and photocurrent characteristic diagram of example 17.

The corresponding photo-current characteristics of the device prepared in this embodiment are tested. As shown in FIG. 8(b) and FIG. 8(c), the corresponding n values are 0.05, and m values are 0 and 0.05 respectively. When light irradiates on the device, the threshold voltage of the device (corresponding to m=0, n=0.05) without cerium oxide shifts negatively significantly, and the subthreshold swing is seriously degraded. In addition, after a certain amount of cerium oxide is doped (corresponding to m=0.05, n=0.05), the threshold voltage of the device has almost no change. The device shows excellent illumination stability, which corresponds to the weak photo-current characteristics in Table 5.

The test results of this embodiment show that doping a certain amount of cerium oxide and europium oxide into the InZnO basis material can effectively control the carrier concentration of the material and improve illumination stability.

Example 18: Thin-Film Transistor

Figure 3:
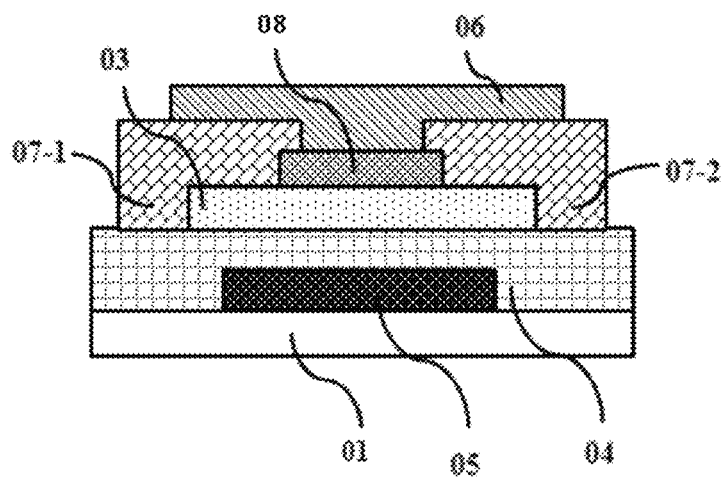
FIG. 3 is a schematic structural diagram of a thin-film transistor of example 18.

A thin-film transistor has an etch-stop structure, with the schematic structural diagram shown in FIG. 3. The thin-film transistor is provided with a substrate 01, a gate electrode 05 located on the substrate 01, an insulating layer 04 located on the substrate 01 and the gate electrode 05, a channel layer 03 covering the upper surface of the insulating layer 04 and corresponding to the gate electrode 05, an etch-stop layer 08, a source electrode 07-1 and a drain electrode 07-2 both spaced apart from each other and electrically connected with both ends of the channel layer 03, and a spacer layer 06.

The substrate 01 is a glass substrate, which is covered with buffer layer 02 silicon oxide.

The gate electrode 05 each have a metal Mo/Al/Mo laminated structure prepared through magnetron sputtering, with a thickness of 50/300/50 nm.

The insulating layer 04 is a laminated structure of silicon nitride ($Si_3N_4$) and silicon oxide ($SiO_2$) prepared by chemical vapor deposition, with a thickness of 250/50 nm, where the silicon nitride is in contact with the gate electrode 05 at the lower layer and the silicon oxide is in contact with the channel layer 03 at the upper layer.

To test the impact of different dysprosium oxide content on device performance, the channel layer 03 is made of the dysprosium oxide- and ytterbium oxide-doped InZnTaO semiconductor material of example 6. Three ceramic targets, InZnTaO, ytterbium oxide-doped InZnTaO (Yb:InZnTaO)

and dysprosium oxide- and ytterbium oxide-doped InZnTiO (Dy—Yb:InZnTaO), are used to prepare thin-films with different ingredient ratios through co-sputtering of a single or two targets and by adjusting the sputtering power of the two targets.

extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

| | Test | 1 | 2 | 3 | 4 | 5 | 6 | 7 | 8 |
|---|---|---|---|---|---|---|---|---|---|
| Dysprosium atom content | m | 0 | 0 | 0.0001 | 0.0010 | 0.0100 | 0.0500 | 0.1000 | 0.1500 |
| Yitterbium atom content | n | 0 | 0.0500 | 0.0500 | | | | | |
| Deposition conditions of the channel layer | Deposition mode | Magnetron sputtering | | | | | | | |
| | $O_2/(Ar + O_2)$ (%) | 10 | | | | | | | |
| | Sputtering pressure (Pa) | 0.3 | | | | | | | |
| | Substrate temperature (° C.) | 200 | | | | | | | |
| Channel layer treatment | Atmosphere annealing treatment | $O_2$-350° C. | | | | | | | |
| Composition of other film layers | Substrate | Glass | | | | | | | |
| | Buffer layer | $SiO_2$ | | | | | | | |
| | Gate electrode | Mo/Al/Mo | | | | | | | |
| | Gate insulating layer | $SiO_2/Si_3N_4$ | | | | | | | |
| | Etch-stop layer | $SiO_2$ | | | | | | | |
| | Source electrode and drain electrode | Mo/Al/Mo | | | | | | | |
| | Spacer layer | $SiO_2$ | | | | | | | |
| Etch-stop layer post-treatment | Atmosphere annealing treatment | $O_2$-350° C. | | | | | | | |
| Thin-film properties | Carrier concentration n ($cm^{-3}$) | 2.20E+19 | 1.20E+18 | 9.50E+17 | 9.10E+17 | 8.40E+17 | 3.00E+17 | 8.20E+16 | 3.30E+16 |
| Device performance | Threshold voltage $V_{th}$ (V) | / | −2.6 | −2.5 | −2.0 | −0.8 | 0.6 | 2.4 | 6.7 |
| | Mobility μ ($cm^2V^{-1}s^{-1}$) | / | 28.3 | 26.5 | 25.1 | 20.8 | 15.2 | 7.6 | 1.8 |
| | Subthreshold swing SS (V/decade) | / | 0.21 | 0.21 | 0.22 | 0.24 | 0.28 | 0.32 | 0.46 |
| | Current on/off ratio $I_{on}/I_{off}$ | / | $10^9$ | $10^9$ | $10^9$ | $10^9$ | $10^9$ | $10^8$ | $10^7$ |
| | Stability | / | Poor | Relatively poor | Good | Excellent | Excellent | Excellent | Excellent |
| | Photo-current characteristics | / | Extremely strong | Strong | Relatively strong | Weak | Weak | Weak | Weak |

Note:
MO in this embodiment is ZnTaO, where In/Zn/Ta = 3/1/0.1 mol, and "/" indicates that the device has no on-off characteristics.

The etch-stop layer 08 and the spacer layer 06 are each made of a silicon oxide ($SiO_2$) thin-film prepared by chemical vapor deposition with a thickness of 300 nm and a deposition temperature of 300° C.

The source electrode 07-1 and the drain electrode 07-2 each have a metal Mo/Al/Mo laminated structure, with a thickness of 50300/50 nm.

In addition, the thin-film transistor of this embodiment may have a closed structure including only a substrate 01, a gate electrode 05, an insulating layer 04, a channel layer 03, an etch-stop layer 08, a source electrode 07-1, a drain electrode 07-2, and a passivation layer, may further include a planarization layer, a reflective electrode, a pixel definite layer, etc., and may further be integrated with other devices.

The patterning process of the thin-film is implemented by photolithography combined with wet or dry etching.

In this embodiment, the specific parameters and the performance of the prepared thin-film transistor device are shown in Table 6. The characterization mode of photo-current characteristics is to irradiate the channel layer 03 of the thin-film transistor device with a commercial white LED light source, evaluate the transfer characteristics of devices under illumination and no-illumination conditions, and It can be seen from Table 6 that the doping of dysprosium oxide and ytterbium oxide has a very obvious impact on the device performance. First, as shown in Test 1 of Table 6, the device prepared from InZnTaO without dysprosium oxide (m=) and ytterbium oxide (n=0) does not show the "on-off" characteristics (on-state) of a thin-film transistor, which indicates that the carrier concentration in the thin-film is too high. As shown in Test 2 of Table 6, after doping of a certain amount of ytterbium oxide (corresponding to m=0, n=0.05), the device shows "on-off" characteristics, with details shown in FIG. 9(a), which indicates that the doping of ytterbium oxide can effectively suppress the carrier concentration in the thin-film, and corresponding Hall data of the thin-film is shown in Table 6. Further, as shown in Tests 2-8 in Table 6, a series of devices with different dysprosium content can be prepared by adjusting the sputtering power of corresponding targets. It should be noted that the device not doped with dysprosium oxide (corresponding to m=0, n=0.05) has relatively high mobility, small subthreshold swing and negative threshold voltage, but its photo-current characteristics are extremely strong. That is, the device characteristics change obviously under the condition of light irradiation (the threshold voltage shifts negatively and the subthreshold swing degrades seriously). However, after the doping of a certain amount of dysprosium oxide, the photo-current characteristics of the device are obviously inhibited. Certainly, with the increase of the dysprosium oxide content, the mobility and other characteristics of the device are further degraded, and the photo-current characteristics are further improved. After excessive dysprosium oxide is doped (for example, m=0.15, n=0.05), the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 9:
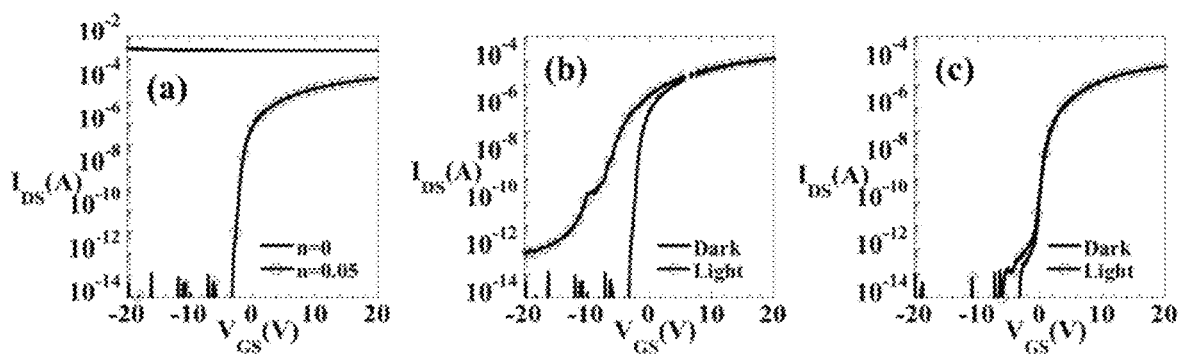
FIG. 9 is a device transfer characteristics and photocurrent characteristic diagram of example 18.

The corresponding photo-current characteristics of the device prepared in this embodiment are tested. As shown in FIG. 9(b) and FIG. 9(c), the corresponding n values are 0.05, and m values are 0 and 0.05 respectively. When light irradiates on the device, the threshold voltage of the device (corresponding to m=0, n=0.05) without dysprosium oxide shifts negatively significantly, and the subthreshold swing is seriously degraded. In addition, after a certain amount of dysprosium oxide is doped (corresponding to m=0.05, n=0.05), the threshold voltage of the device has almost no change. The device shows excellent illumination stability, which corresponds to the weak photo-current characteristics in Table 6.

The test results of this embodiment show that doping a certain amount of dysprosium oxide and ytterbium oxide into the InZnTaO basis material can effectively control the carrier concentration of the material and improve illumination stability.

Example 19: Display Panel

A display panel includes the thin-film transistor in each of examples 13-18, and the thin-film transistor is configured to drive a display unit in the display panel.

Example 20: Detector

A detector includes the thin-film transistor in each of examples 13-18, and the thin-film transistor is configured to drive a detection unit of the detector.

Each functional layer of the thin-film transistor implemented by the present invention is further described below.

The substrate in the present invention is not particularly limited, and a substrate 01 well known in the art can be used. For example, the substrate is made of hard alkali glass, alkali-free glass, quartz glass, or silicon; or may be made of flexible polyimide (PI), polyethylene naphthalate (PEN), polyethylene terephthalate (PET), polyethylene (PE), polypropylene (PP), polystyrene (PS), polyether sulfone (PES) or a metal sheet.

The materials of the gate electrode 05 in the present invention are not particularly limited, and may be arbitrarily selected from materials well known in the art. For example, the materials are transparent conductive oxides (ITO, AZO, GZO, IZO, ITZO, FTO, etc.), metals (Mo, Al, Cu, Ag, Ti, Au, Ta, Cr, Ni, etc.) and alloys thereof, metals and oxides (ITO/Ag/ITO, IZO/Ag/IZO, etc.), and composite conductive thin-films formed by stacking metals (Mo/Al/Mo, Ti/Al/Ti, etc.).

The methods for preparing gate electrode 05 thin-films may be sputtering, electroplating, thermal evaporation and other deposition methods, and preferably sputtering deposition. Because the thin-films prepared by this method have good adhesion to a substrate 01 and excellent uniformity, the thin-films can be prepared in a large area.

Here, the specific structure of the gate electrode needs to be determined according to the technical parameters to be achieved. For example, if a transparent electrode needs to be used in transparent display, single-layer ITO may be used as the gate electrode or ITO/Ag/ITO may be used as the gate electrode. In addition, if a high temperature process is needed in the application in special fields, a metal alloy thin-film which can resist high temperature may be selected as the gate electrode.

The materials of the insulating layer 04 in the present invention are not particularly limited, and may be arbitrarily selected from materials well known in the art. For example, the materials are silicon oxide, silicon nitride, alumina, tantalum oxide, hafnium oxide, yttrium oxide, and polymer organic film layers.

It should be pointed out that the components of these insulating thin-films may be inconsistent with a theoretical stoichiometric ratio. In addition, the insulating layer 04 may be formed by stacking various insulating films, which can implement better insulating characteristics and improve the interface characteristics between the channel layer 03 and the insulating layer 04. Moreover, the insulating layer 04 may be prepared in various ways, such as physical vapor deposition, chemical vapor deposition, atomic layer deposition, laser deposition, anodic oxidation or a solution method.

The etchant used in wet etching includes a mixed solution of phosphoric acid, nitric acid and glacial acetic acid or a mixed solution based on hydrogen peroxide. The etching rate of an MO semiconductor material in a hydrogen peroxide-based etchant is less than 1 nm/min. Dry etching, for example, may be implemented by plasma etching, and an etching gas includes a chlorine-based or fluorine-based gas.

In the process of adopting vacuum magnetron sputtering for MO semiconductor materials, single-target sputtering or multi-target co-sputtering may be adopted, and single-target sputtering is preferred.

This is because the single-target sputtering can implement a thin-film with better repeatability and stability, and the microstructure of the thin-film is easier to control. This is unlike a co-sputtering thin-film in which sputtered particles are subjected to interference by more factors in the process of recombination.

In the vacuum sputtering deposition process, a power supply may be radio frequency (RF) sputtering, direct current (DC) sputtering or alternating current (AC) sputtering, and the AC sputtering commonly used in industry is preferred.

In the sputtering deposition process, the sputtering pressure may be selected from a range of 0.1-10 Pa, preferably 0.3-0.7 Pa.

When the sputtering pressure is excessively low, stable glow sputtering cannot be maintained. When the sputtering pressure is excessively high, the scattering and energy loss of sputtered particles in the process of deposition on a substrate 01 increase obviously, so that the kinetic energy decreases after the sputtered particles reach the substrate 01, and defects of formed thin-films increase, thereby seriously affecting the performance of a device.

In the sputtering deposition process, the oxygen partial pressure is optional in the range of 0-1 Pa, preferably 0.001-0.5 Pa, and more preferably 0.01-0.1 Pa.

Oxygen partial pressure generally has a direct impact on the carrier concentration of a thin-film in the process of preparing an oxide semiconductor by sputtering, and some defects related to oxygen vacancies may be introduced. Excessively low oxygen content may cause serious oxygen mismatch and increase of carrier concentration in the thin-film, while excessively high oxygen vacancies may cause more weak bonds and reduce the reliability of the device.

In the sputtering deposition process, the substrate temperature is preferably 200-300° C.

In the process of channel layer thin-film deposition, a certain substrate temperature can effectively improve the bonding mode of sputtered particles after the sputtered particles reach the substrate 01, thereby reducing the probability of occurrence of weak bonds, and improving the stability of the device. Certainly, the same effect can also be achieved by subsequent annealing treatment and other processes.

The thickness of the channel layer 03 is optional in the range of 2-100 nm, preferably 5-50 nm, and more preferably 20-40 nm.

The materials of the source electrode and the drain electrode in the present invention are not particularly limited, and may be arbitrarily selected from materials well known in the art on the premise that the implementation of devices with various required structures is not affected. For example, the materials are transparent conductive oxides (ITO, AZO, GZO, IZO, ITZO, FTO, etc.), metals (Mo, Al, Cu, Ag, Ti, Au, Ta, Cr, Ni, etc.) and alloys thereof, metals and oxides (ITO/Ag/ITO, IZO/Ag/ZO, etc.), and composite conductive thin-films formed by stacking metals (Mo/Al/Mo, Ti/Al/Ti, etc.).

The methods for preparing thin-films of the source electrode and the drain electrode may be sputtering, thermal evaporation and other deposition methods, and preferably sputtering deposition. Because the thin-films prepared by this method have good adhesion to a substrate 01 and excellent uniformity, the thin-films can be prepared in a large area.

Here, it should be noted that in the preparation of a device with a back-channel etch structure, the source electrode, the drain electrode and the channel layer 03 need to have a proper etching selectivity, otherwise the device cannot be prepared. The etchant for wet etching in the embodiment of the present invention is an etchant (such as hydrogen peroxide-based etchant) based on conventional metals in industry. This is mainly because the MO semiconductor material of the present invention can effectively resist the etching of the wet hydrogen peroxide-based etchant, and has a high etching selectivity with metals (such as molybdenum, molybdenum alloy, and molybdenum/aluminum/molybdenum). The MO semiconductor layer is basically not affected by the etchant, and the prepared device has excellent performance and good stability. In addition, the dry etching in the embodiment of the present invention is based on conventional etching gases (such as chlorine-based gases and fluorine-based gases) in industry, and has little impact on the oxide semiconductor layer of the present invention, so the prepared device has excellent performance and good stability.

The materials of the passivation layer in the present invention are not particularly limited, and may be arbitrarily selected from materials well known in the art. For example, the materials are silicon oxide, silicon nitride, alumina, tantalum oxide, hafnium oxide, yttrium oxide, and polymer organic film layers.

It should be pointed out that the components of these insulating thin-films may be inconsistent with a theoretical stoichiometric ratio. In addition, the insulating layer 04 may be formed by stacking various insulating films, which can implement better insulating characteristics and improve the interface characteristics between the channel layer 03 and the passivation layer. Moreover, the passivation layer may be prepared in various ways, such as physical vapor deposition, chemical vapor deposition, atomic layer deposition, laser deposition, or a solution method.

The processing technology in the thin-film transistor preparation process implemented by the present invention is further described below.

Relatively, because of the participation of high-energy plasma, the deposition rate of thin-films prepared by sputtering is generally faster. There is no enough time to perform the relaxation process of the thin-films during the deposition process. This may result in dislocation in a certain proportion and stress remaining in the thin-films. This requires post heat annealing treatment to continue to achieve the required relatively steady state and improve the properties of the thin-films.

In the implementation of the present invention, annealing treatment is mostly set after the deposition of the channel layer 03 and after the deposition of the passivation layer. On the one hand, the annealing treatment after the deposition of the channel layer 03 can effectively improve in-situ defects in the channel layer 03 and improve the ability of the channel layer 03 to resist possible damage in the subsequent process. On the other hand, in the subsequent passivation layer deposition process, due to the participation of plasma and the modification of active groups, this may require an "activation" process to further eliminate the effects of an interface state, some donor doping, etc.

In addition, in the implementation of the present invention, the treatment modes may include not only heating treatment, but also plasma treatment interfaces (such as an insulating layer 04/semiconductor interface and a channel layer 03/passivation layer interface).

The foregoing treatment processes can effectively improve the performance and stability of the device.

The foregoing embodiments are preferred embodiments of the present invention. However, the embodiments of the present invention are not limited by the foregoing embodiments. Any other changes, modifications, replacements, combinations and simplifications made without departing from the spirit and principle of the present invention should all be equivalent replacement manners, and fall within the protection scope of the present invention.

What is claimed is:

1. A metal oxide (MO) semiconductor, wherein the metal oxide semiconductor is implemented by respectively doping at least an oxide of rare earth element R and an oxide of rare earth element R' into an indium-containing metal oxide MO—$In_2O_3$ semiconductor to form an $In_xM_yR_nR'_mO_z$ semiconductor material, wherein $x+y+m+n=1$, $0.4<x<0.9999$, $0<y<0.3$, $0.06<(m+n)<0.2$, $m>0$, $n>0$, and $z>0$, wherein M is one selected from Zn, Ga, Sn, Ti, Zr, and Ta, or a combination of any two or more thereof, R is Eu or Yb, and R' is Pr, or Ce or Dy.

2. The MO semiconductor of claim 1, wherein the MO semiconductor is prepared into a film by adopting any one of a physical vapor deposition process, a chemical vapor deposition process, an atomic layer deposition process, a laser deposition process, a Reactive-Plasma Deposition (RPD) process and a solution method.

3. A thin-film transistor, comprising a gate electrode, an active layer, an insulating layer located between the gate electrode and the active layer, a source electrode and a drain electrode electrically connected to both ends of the active layer respectively, and a spacer layer, wherein the active layer is the MO semiconductor of claim 1.

4. The thin-film transistor of claim 3, wherein the spacer layer is one layer structure selected from a silicon oxide thin-film, a silicon nitride thin-film and a silicon oxynitride thin-film prepared by plasma-enhanced chemical vapor deposition or a laminated structure composed of any arbitrary two or more thereof.

\* \* \* \* \*